(12) United States Patent
Chappell et al.

(10) Patent No.: US 8,816,807 B2
(45) Date of Patent: Aug. 26, 2014

(54) CONTROLLED SELF ASSEMBLY OF ANISOTROPIC CONDUCTIVE ADHESIVES BASED ON FERROMAGNETIC PARTICLES

(75) Inventors: William J. Chappell, Lafayette, IN (US); Sungwook Moon, Lafayette, IN (US); Nestor A. Rojas, West Lafayette, IN (US); Maria Bellorin, legal representative, Key Biscayne, FL (US)

(73) Assignee: Purdue Research Foundation, West Lafayette, IN (US)

( * ) Notice: Subject to any disclaimer, the term of this patent is extended or adjusted under 35 U.S.C. 154(b) by 420 days.

(21) Appl. No.: 13/114,024

(22) Filed: May 23, 2011

(65) Prior Publication Data
US 2011/0284262 A1    Nov. 24, 2011

Related U.S. Application Data

(60) Provisional application No. 61/347,138, filed on May 21, 2010.

(51) Int. Cl.
| | |
|---|---|
| H01F 1/00 | (2006.01) |
| H01F 3/00 | (2006.01) |
| H01F 7/00 | (2006.01) |
| H05K 3/32 | (2006.01) |
| B29C 70/62 | (2006.01) |

(52) U.S. Cl.
CPC .......... *B29C 70/62* (2013.01); *H05K 3/323* (2013.01); *H05K 2201/083* (2013.01); *B29K 2995/0008* (2013.01)
USPC ......................................... 335/296; 335/219

(58) Field of Classification Search
USPC ............................................... 335/219, 296
See application file for complete search history.

(56) References Cited

U.S. PATENT DOCUMENTS

| | | | | |
|---|---|---|---|---|
| 3,014,104 A | * | 12/1961 | Burger et al. | 337/90 |
| 4,170,677 A | * | 10/1979 | Hutcheson | 428/119 |
| 4,546,037 A | * | 10/1985 | King | 428/323 |
| 4,548,862 A | * | 10/1985 | Hartman | 428/323 |
| 4,554,033 A | * | 11/1985 | Dery et al. | 156/52 |
| 4,644,101 A | * | 2/1987 | Jin et al. | 178/18.05 |
| 4,729,809 A | * | 3/1988 | Dery et al. | 156/306.6 |
| 4,740,657 A | * | 4/1988 | Tsukagoshi et al. | 174/88 R |
| 4,744,850 A | * | 5/1988 | Imano et al. | 156/265 |
| 4,902,857 A | * | 2/1990 | Cranston et al. | 174/94 R |
| 5,221,417 A | * | 6/1993 | Basavanhally | 216/22 |
| 5,328,087 A | * | 7/1994 | Nelson et al. | 228/175 |
| 5,616,206 A | * | 4/1997 | Sakatsu et al. | 156/230 |
| 5,661,042 A | * | 8/1997 | Fang et al. | 438/17 |
| 5,769,996 A | * | 6/1998 | McArdle et al. | 156/272.4 |
| 6,110,399 A | * | 8/2000 | McArdle et al. | 252/513 |

(Continued)

FOREIGN PATENT DOCUMENTS

| | | | | |
|---|---|---|---|---|
| JP | 01054608 A | * | 3/1989 | |
| JP | 04117477 A | * | 4/1992 | |

*Primary Examiner* — Mohamad Musleh
(74) *Attorney, Agent, or Firm* — Ice Miller LLP

(57) ABSTRACT

An anisotropic conductive adhesive (ACA) arrangement is disclosed, including a thermosetting resin disposed between a connector of a first structure and a connector of a second structure, and a plurality of ferromagnetic conductive particles dispersed through the thermosetting resin, wherein the plurality of ferromagnetic conductive particles form columns between the connector of the first structure and the connector of the second structure, and wherein a density of the ferromagnetic particles in the columns is substantially higher than a density of the plurality of ferromagnetic particles away from the columns.

11 Claims, 10 Drawing Sheets

(56) References Cited

U.S. PATENT DOCUMENTS

| | | | |
|---|---|---|---|
| 6,977,024 B2 * | 12/2005 | Yamazaki et al. | 156/235 |
| 7,294,358 B2 * | 11/2007 | Tam | 427/58 |
| 7,326,316 B2 * | 2/2008 | Cobbley et al. | 156/330 |
| 7,911,064 B2 * | 3/2011 | Komatsu et al. | 257/777 |
| 2002/0005247 A1 * | 1/2002 | Graham et al. | 156/291 |
| 2002/0084019 A1 * | 7/2002 | Date et al. | 156/206 |
| 2003/0049425 A1 * | 3/2003 | Ono et al. | 428/217 |
| 2006/0048889 A1 * | 3/2006 | Feil et al. | 156/285 |

* cited by examiner

CONTROLLED SELF ASSEMBLY OF ANISOTROPIC CONDUCTIVE ADHESIVES BASED ON FERROMAGNETIC PARTICLES

PRIORITY

The present U.S. application is related to, and claims the priority benefit of, U.S. Patent Application Ser. No. 61/347,138, filed May 21, 2010, the contents of which is hereby incorporated by reference in its entirety into this disclosure.

STATEMENT REGARDING GOVERNMENT FUNDING

This invention was made with government support under N00178-04-D-4139 awarded by Department of Defense. The government has certain rights in the invention.

TECHNICAL FIELD

The present disclosure generally relates to interconnectivity between electronic circuits and in particular to interconnectivity using an anisotropic conductive adhesive.

BACKGROUND

In the current state of technology, integrated circuits (ICs) play a major role. In almost every electronic application, there are not just one but many ICs that are utilized. To reduce manufacturing costs and increase functionalities, ICs have become smaller and more dense with incredible complexities over the years. The increase in miniaturization and complexity is often coupled with the need to have more interconnects (i.e., pads) to other ICs and/or a substrate (e.g., a circuit board). The spacing between the pads (pitch) is often governed by manufacturing and assembly limitations. The pitch governs how many pads can be provided on an IC. As a result of this limitation, in some instances a sufficient number of pads is not available (i.e., the IC is pad limited) for all the necessary interconnects.

Also, many electronic systems are implemented in a single chip package where the entire system is integrated on a common packaging substrate. In addition, wafer-level integrated passive device (IPD) technology has been developed offering high performance solutions, reducing board level complexity, and improving ease of passive assembly. Also, many efforts to improve circuit bandwidth and density have been made based on 3-dimensional integration packaging technologies. This 3-D circuitry can shorten interconnects to reduce parasitic capacitance, resistance, and inductance, resulting in higher speed and functionality, and reduce interconnect powerloss and crosstalk. These advantages are, for example, successively applied to integrating sensors and front end electronics within pixel cells in display applications for higher performance. In addition, a wafer-scale heterogeneous integration technology has been recently developed in which batch fabrication capability, high interconnect density, high integration level, and compactness with comparable system cost are combined. These developments enable going beyond the limitation of monolithic devices in a compact form factor, offering both the performance advantages (gain and bandwidth) of III-V compound devices coupled with incredible integration level of silicon material.

Integration of III-V devices on a complementary metal oxide semiconductor (CMOS) silicon substrate remains a challenge given that the state-of-the-art input and output pitch sizes are 200 µm. In addition, many three dimensional silicon-on-silicon IC arrangements also pose a challenge for interconnectivity of pads associated with each IC. In many cases, given the fast pace of integration and development of technologies, however this pitch size is incompatible with the required number of pads.

One way to address the required number of pads is to use the pads for multiple purposes, e.g., pads used for a test mode and an operational mode. However, multi-use pads lead to additional complexity both from construction as well as operation.

Another way to address the required number of pads is to reduce the pitch between the pads. There are several interconnect technologies that affect the pitch. In wirebond technology, wires are connected between the pads and external components (i.e., pads of another IC or landing traces on a circuit board). In flipchip technology, bumps formed on pads are utilized to make the required connection. Other technologies are also available, e.g., multichip bonding approaches to three-dimensional ICs utilizing through-silicon-vias (TSV) for making interconnectivity between the several ICs and the substrate. In each of these technologies, several factors are involved in determining the minimum pitch in a fine-pitch interconnection arrangement between one IC and another IC or a substrate. These fine-pitch factors include crosstalk between wires resulting from cross-capacitance, parasitic resistance and inductance, all of which affect operational speed and functionality of the affected devices.

One way to reduce the pitch is to use an isotropic conductive adhesive (ACA) between the pads and other interconnection, as known to a person of ordinary skill in the art. The ACA includes a curable resin with conductive particles dispersed therein with a uniform density. Using ferromagnetic conductive particles allow alignment of these particles as a function of an applied external magnetic field. Referring to FIG. 10, a prior art ACA arrangement 10 is depicted as an approach to interconnecting pads. The ACA arrangement 10 is defined by substrates 12 and conductive pads 14. For improved conductivity, conductive pads 14 can be made from gold, silver, copper, or other highly conductive material. The conductive pads 14 are in contact with the substrates 12, thereby electrically coupling to the substrates 12. The ACA includes a curable resin 16 in which ferromagnetic conductive particles 18 are uniformly dispersed (not shown). Application of an external magnetic field 20, causes formation of poles (N and S) on the ferromagnetic conductive particles 18. Further, upon application of the external magnetic field 20, the ferromagnetic conductive particles 18 interact with each other and align along direction of the magnetic field 20 with a non-uniform alignment dispersion 22, as depicted in FIG. 10. While not shown, there may be stray ferromagnetic conductive particles 18 dispersed throughout the curable resin 16, resulting in a heightened parasitic capacitance. Once the ferromagnetic conductive particles 18 are aligned, the curable resin 16 can be cured to lock the ferromagnetic conductive particles 18 in place.

One benefit in the prior art ACA application depicted in FIG. 10 is that it has good performance in high-density applications with input/output (I/O) pads of less than 100 µm×100 lam in area. This benefit is arrived at because the formed columns are substantially insulated from the closely-located neighboring pads. However, the ACA arrangement of the prior art may result in high resistance values because the number of vertical conductive columns (three shown) depends on the portions of the pads 14 that are overlapped. Additionally and more specifically, physical contact between the ferromagnetic conductive particles 18 and the pads 14 is weak when compared to conventional bonding techniques (TSV and solder bumps). In addition, in certain manufacturing circumstances the ferromagnetic particles forming the columns in the prior art ACA interconnects may even result in open circuits. Therefore, there is a fundamental limitation as to how low a resistance (<0.88Ω at 100 μm×100 μm pad area) can be achieved with the ACA arrangement of the prior art.

In the situation as depicted in FIG. 10, one goal is to generate well formed columns of ferromagnetic conductive particles 18 between the pads 14 in order to provide high current density capabilities with low ohmic contact resistance. Another goal is to reduce parasitic capacitance between the column that are formed between the pads 14 and the column that are formed outside the pads 14. As shown in FIG. 10, the interaction between the ferromagnetic conductive particles 18 and the pads 14 can only meet the desired goals in a limited fashion. Specifically, the current carrying capability along columns of the ferromagnetic conductive particles 18 in between the pads 14 is limited to how tightly these particles form in the columns. Small gaps between the ferromagnetic conductive particles 18 can cause the resistance between the pads to increase dramatically. The density of columns is a function of the loading density of the original particles in the epoxy, which is fundamentally limited if separate columns are to be formed since agglomeration occurs with a high loading density. This limit means that there will always be sparse columns on the pads unless a new process is developed in which columns are preferentially formed in desired locations. In addition, the non-uniform alignment dispersion 22 between the columns that are formed between the pads 14 and the columns that are formed outside the pads, can result in a high parasitic capacitance.

Furthermore, weakening of the contact junction between the ferromagnetic conductive particles 18 and between the particles 18 and the pads 14 in presence of external thermal energy is also a major challenge. This weakening occurs because of a large difference of coefficient of thermal expansion (CTE) of the epoxy material and the particles.

Therefore, a simple and low-cost interconnection technology is needed that meets fine-pitch interconnection requirements allowing devices to operate at desired speed and functionality, provide superior ohmic characteristics between interconnects and minimize parasitic capacitance.

SUMMARY

In one form, the present disclosure provides an anisotropic conductive adhesive (ACA) arrangement. The ACA arrangement includes a thermosetting resin disposed between a connector of a first structure and a connector of a second structure. The ACA arrangement further includes a plurality of ferromagnetic conductive particles dispersed through the thermosetting resin. The plurality of ferromagnetic conductive particles form columns between the connector of the first structure and the connector of the second structure. A density of the ferromagnetic particles in the columns is substantially higher than a density of the plurality of ferromagnetic particles away from the columns.

In another form, the present disclosure provides an anisotropic conductive adhesive (ACA) arrangement. The ACA arrangement includes a thermosetting resin disposed between a connector of a first structure and a connector of a second structure. The ACA arrangement further includes a plurality of ferromagnetic conductive particles dispersed through the thermosetting resin. Also, the ACA arrangement includes a first ferromagnetic formation disposed on the connector of the first structure. The ACA arrangement also include a second ferromagnetic formation disposed on the connector of the second structure. The plurality of ferromagnetic conductive particles form columns between the first ferromagnetic formation and the second ferromagnetic formation. Density of the ferromagnetic particles in the columns is substantially higher than density of the plurality of ferromagnetic particles away from the column.

In yet another form, a process for forming an anisotropic conductive adhesive (ACA) arrangement is disclosed. The process includes forming a layer of ferromagnetic material on at least one connector of a first structure and a second structure. The process also includes symmetrically aligning the connectors of the first and second structures. Furthermore, the process includes loading a curable resin including a plurality of ferromagnetic conductive particles between the connectors of the first and second structures. The process also include applying a steady state magnetic field between the connectors of the first and second structures. In response to the application of the steady state magnetic field, columns of the plurality of ferromagnetic conductive particles form between the connectors of the first and second structures. Density of the plurality of ferromagnetic particles in the columns is substantially higher than density of the plurality of ferromagnetic particles away from the columns. The process also includes applying heat or ultraviolet light to the curable resin to cure the curable resin.

DETAILED DESCRIPTION

Figure 1A:
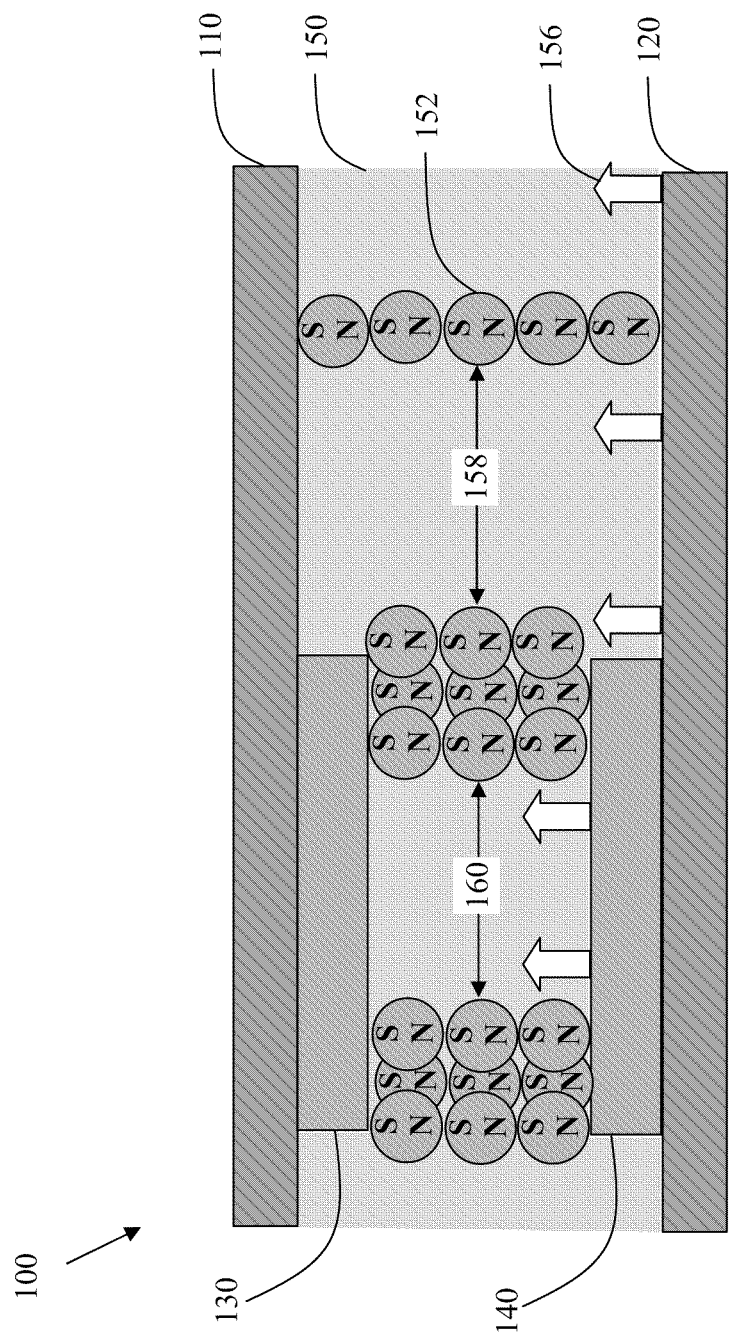
FIG. 1A is a schematic of an anisotropic conductive adhesive (ACA) arrangement according to one embodiment of the present disclosure including two aligned pads each including a ferromagnetic material.

For the purposes of promoting an understanding of the principles of the present disclosure, reference will now be made to the embodiments illustrated in the drawings, and specific language will be used to describe the same. It will nevertheless be understood that no limitation of the scope of this disclosure is thereby intended.

A novel arrangement and method of forming same are discussed for preferential growth of columns of ferromagnetic conductive particles between pads using an anisotropic conductive adhesive (ACA) arrangement in electronic circuits. The approach increases column density in specific areas between the pads, instead of forming non-uniformly distributed columns. The particles self-assemble between the pads. This type of formation can be achieved by using ferromagnetic I/O pads to attract the randomly dispersed ferromagnetic conductive particles. The I/O pads can be formed by depositing or growing a thick layer of ferromagnetic material. Application of an external magnetic field results in a drastic increase in the number of columns in each electrical connection between the pads.

Referring to FIG. 1, a schematic of an ACA arrangement 100 according to one embodiment of the present disclosure is depicted. The ACA arrangement 100 includes a first substrate 110 and a second substrate 120. The first and second substrates 110 and 120 can be representative of a substrate of an integrated circuit (IC) of a 3-dimensional integration arrangement, substrate of a circuit board (e.g., an FR-4 circuit board), and combinations thereof.

The ACA arrangement 100 also includes a first pad 130 and a second pad 140. The pads 130 and 140 include thick layers of ferromagnetic material (also referred to as ferromagnetic formations) formed by a deposition process (e.g., by vapor deposition, plating, or mechanical deposition), a growing process, or other processes known to a person of ordinary skill in the art.

In addition, the ACA arrangement 100 includes a curable resin or a thermosetting resin 150 which contains ferromagnetic conductive particles 152. The ferromagnetic conductive particles 152 are initially uniformly dispersed in the curable resin 150. Once an external magnetic force is applied, induced magnetic field 156 forms poles in the ferromagnetic conductive particles 152 causing these particles to be attracted to one another thereby forming columns between the pads 130 and 140. In particular, by magnetic force interaction, the induced magnetization of the pads 130 and 140, which as described above include layers of ferromagnetic material, enables the attraction of neighboring ferromagnetic conductive particles 152 toward the pad so that the column density between the pads, and in particular near the edges, is greatly increased. Therefore, density of the ferromagnetic conductive particles 152 in columns formed in an envelope between the first ferromagnetic formation 130 and the second ferromagnetic formation 140 is substantially higher than the density of the ferromagnetic conductive particles 152 away form the columns and outside of the envelope.

Figure 1B:
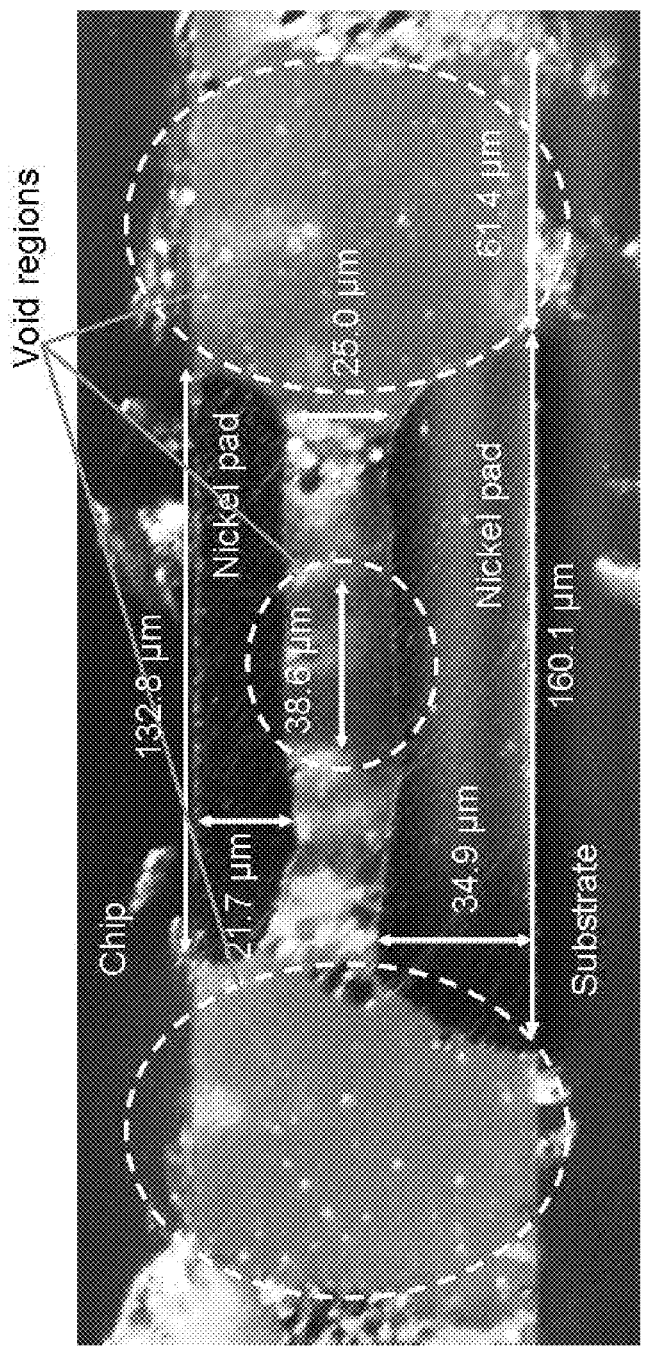
FIG. 1B is a microscopic photograph of a cross-sectional view of the ACA arrangement of FIG. 1A.
Figure 10:
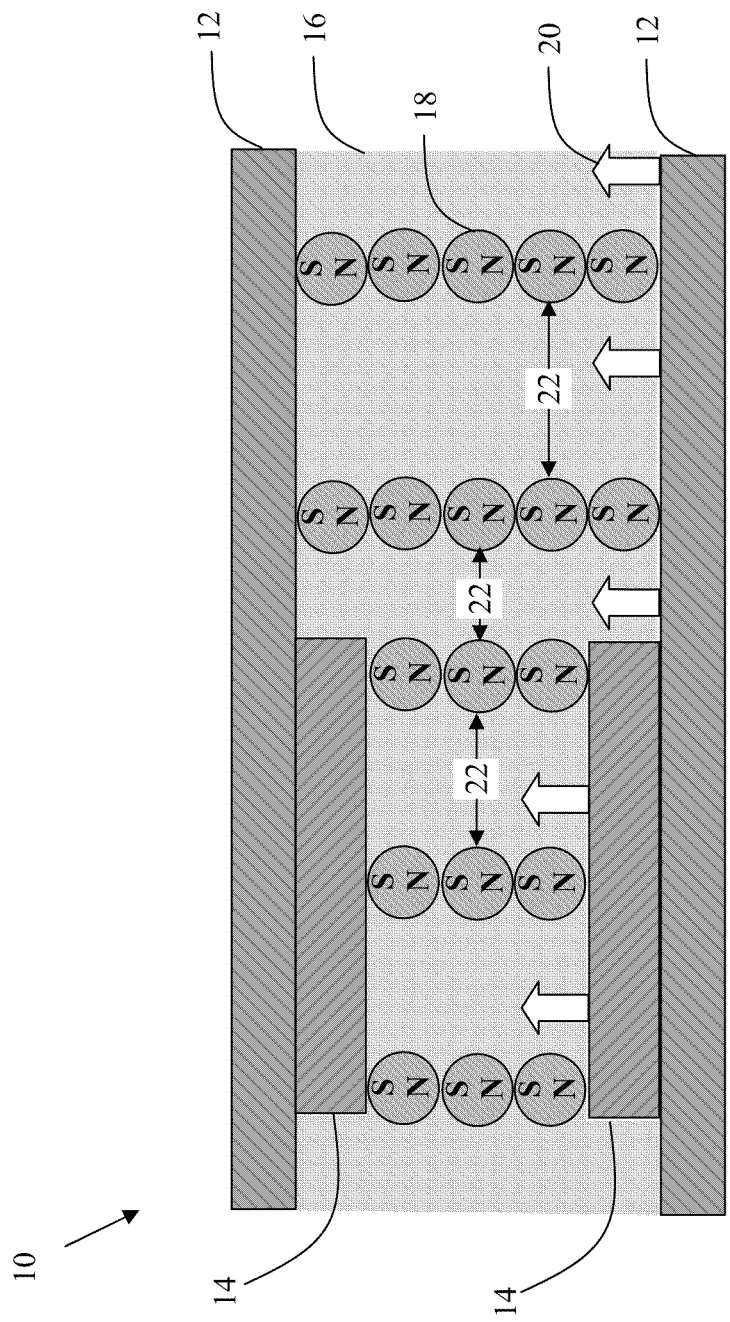
FIG. 10 is a schematic of an ACA arrangement of prior art including non-uniform alignment dispersion of ferromagnetic conductive particles.

In the prior art ACA arrangement (shown in FIG. 10), columns are non-uniformly distributed over the test sample. In contrast, in the ACA arrangement of the present disclosure, void regions are formed in the curable resin 150 near the boundaries of the pads 130 and 140. These voids are caused by the attraction and agglomeration of ferromagnetic conductive particles 152 to the boundaries of the magnetized pads 130 and 140. These void regions are indicative of missing ferromagnetic conductive particles 152 which advantageously improve the conductivity between the pads 130 and 140 and minimize parasitic capacitance between the pads 130 and 140 and the columns of the ferromagnetic conductive particles 152 and the substrates 110 and 120 or other nearby columns. As a result, the average resistance of the ACA arrangement of the present disclosure is measured to be 0.13Ω, a reduction of 74% as compared to the prior art arrangement depicted in FIG. 10. The separation at the void regions for the present ACA arrangement was measured to be about 41 µm, as seen in FIG. 1B. FIG. 1B depicts a microscopic photograph of the formed columns between the pads 130 and 140 of a cross-sectional view of the ACA arrangement of FIG. 1A. The nickel metal of the upper pad 130 is 21.7 µm thick, and that of the lower pad 140 is 34.9 µm thick. The formed columns are observed to be dense at the edge of both pads 130 and 140. Interpad voids 158 (see FIG. 1A) are formed between neighboring pads in a horizontal direction while intrapad voids 160 are formed between two vertically aligned pads 130 and 140. The widths of the interpad voids 158 and the intrapad voids 160 were measured to be about 38.6 µm and 61.4 µm wide, respectively for the size of pads discussed above and depicted in FIG. 1B.

Figure 2:
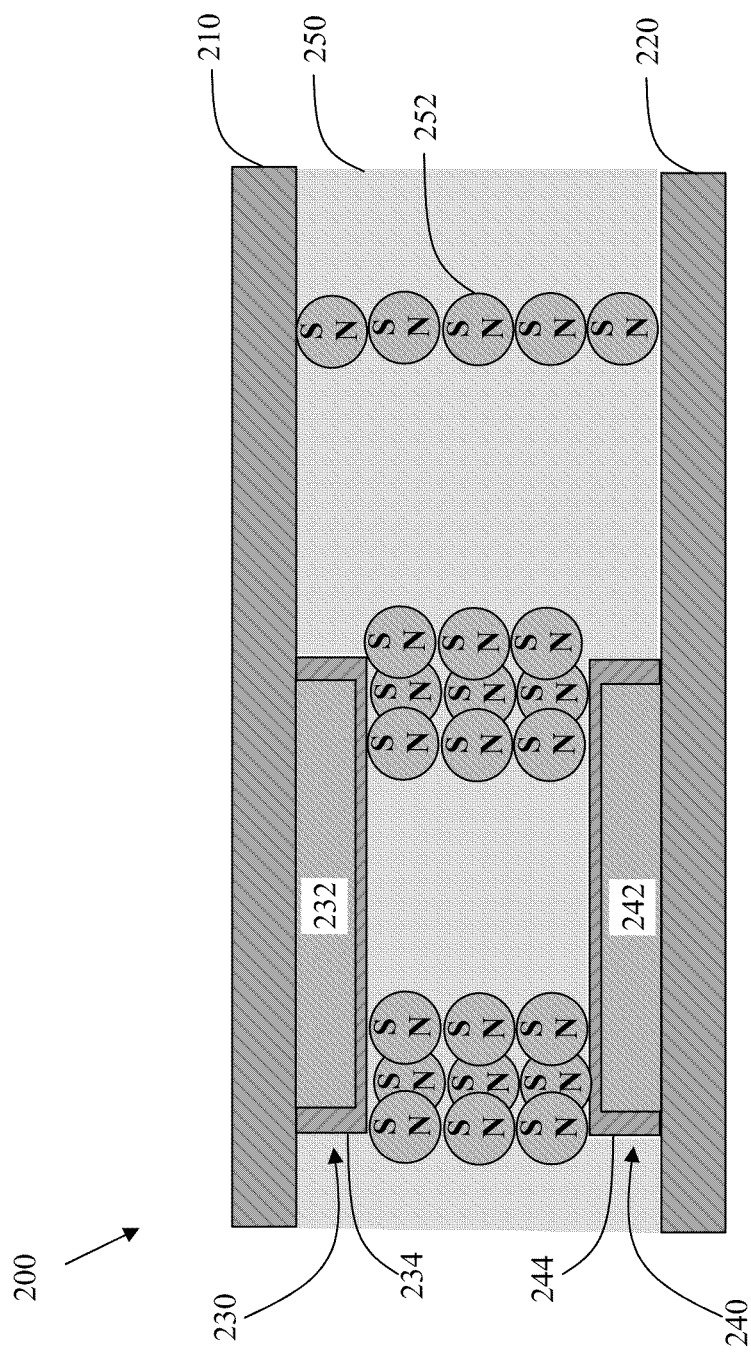
FIG. 2 is a schematic of the ACA arrangement according to another embodiment of the present disclosure including two aligned pads each including a ferromagnetic material coated with a high-conductivity material.

Referring to FIG. 2, a schematic of an alternative ACA arrangement 200 according to one embodiment of the present disclosure is depicted. The ACA arrangement 200 includes a first substrate 210 and a second substrate 220. The first and second substrates 210 and 220 can be representative of a substrate of an integrated circuit (IC) of a 3-dimensional integration arrangement, substrate of a circuit board (e.g., an FR-4 circuit board), and combinations thereof.

The ACA arrangement 200 also includes a first pad 230 and a second pad 240. The pads 230 and 240 include thick layers of ferromagnetic material (also referred to as ferromagnetic formations) 232 and 242, respectively formed by a deposition process (e.g., by chemical vapor deposition, plating, electroplating or mechanical deposition), a growing process, or other processes known to a person of ordinary skill in the art. The pads 230 and 240 also include highly conductive layers 234 and 244, respectively, formed on the ferromagnetic cores 232 and 242.

In addition, the ACA arrangement 200 includes a curable resin (or a thermosetting resin) 250 which contains ferromagnetic conductive particles 252. The ferromagnetic conductive particles 252 are initially uniformly dispersed in the curable resin 250. Once an external magnetic force is applied induced magnetic field forms poles in the ferromagnetic conductive particles 252 causing these particles to be attracted to one another thereby forming columns between the pads 230 and 240.

While the ferromagnetic formations 232 and 242 generally produce the same magnetic effect on the ferromagnetic particles 252 (namely, forming high concentrations of ferromagnetic particles 252 near the edges of the pads 230 and 240 with interpad void regions between neighboring pads as well as intrapad void regions between two vertically aligned pads, or as described below with respect to FIG. 7A even between misaligned pads), the highly conductive layers 234 and 244 provide improved electrical connections to the substrate and active circuitry adjacent the pads.

Figure 3:
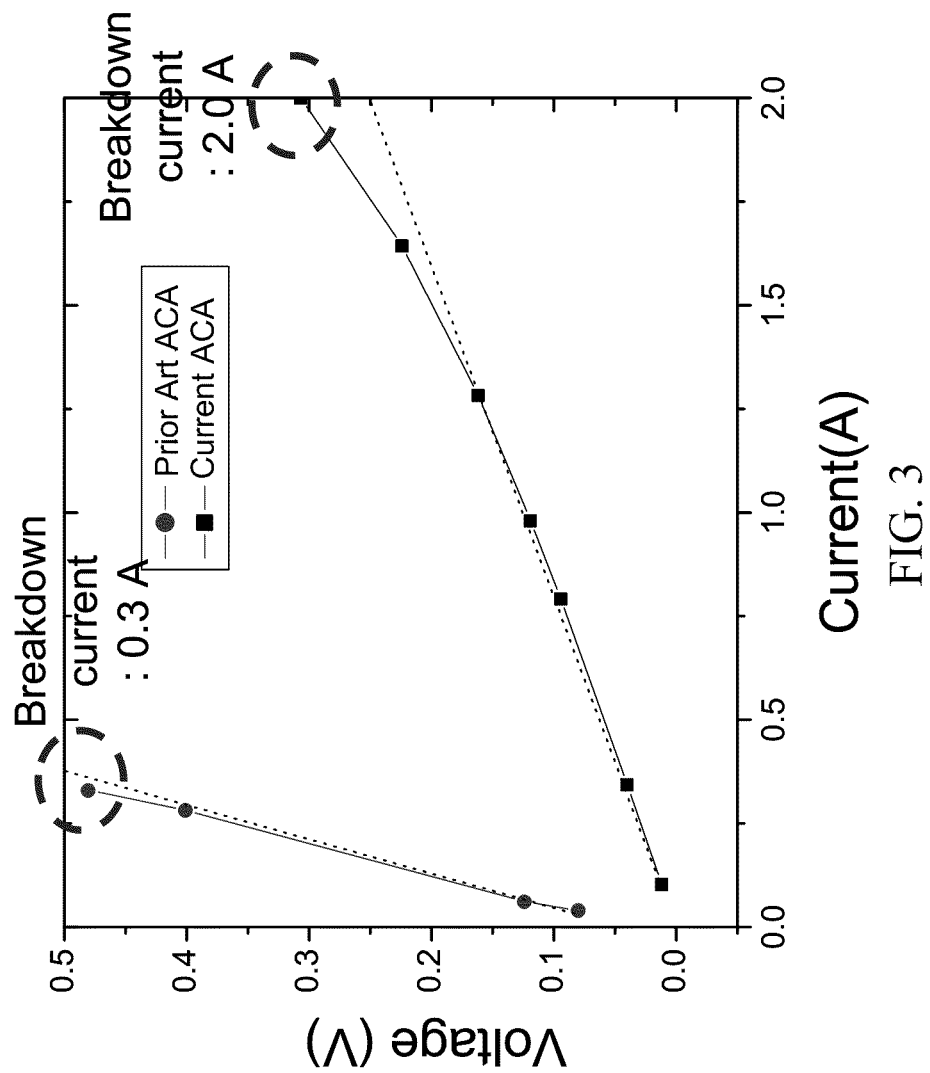
FIG. 3 is a graph of voltage vs. current resulting from a power-handling test for an ACA arrangement of the prior art as well as the ACA arrangement of FIG. 1A.

Referring to FIG. 3, results of a high power handling test is provided. In particular, FIG. 3 depicts a graph of voltage vs. current for a breakdown test for both the ACA arrangement of the prior art (see FIG. 10) and the ACA arrangement of the present disclosure (see FIG. 1). One limitation of the prior art ACA interconnects (see FIG. 10) is the ability to operate with high currents through the interconnects. As described above, the connections rely on magnetic interaction to connect distributed particles and a curing temperature to lock in their alignment. In a high power application, the high current density through the interconnects generates enough heat to cause thermal expansion of the cured epoxy. This causes weakening of the contact between the conductive particles. This effect, in turn, results in increased resistance of the prior art ACA interconnects. This increase in resistance generates a non-linear resistance response which would be detrimental to performance by, among other aspects, inducing frequency conversion and distortion of a signal passing through the interconnects. In an extreme case, the particles become dislodged and the interconnects become open circuits. Thus, for improving the high-power capability of the interconnects, the column density needs to be higher and the column aspect ratio needs to be thicker in order to distribute higher current density over an entire pad.

In order to explore the high-power handling performance of the ACA arrangement according to the present disclosure, a power-handing test was performed by applying DC power through the prior art ACA interconnects as well as the ACA arrangement of the present disclosure. As a result, the breakdown current of the ACA arrangement of the present disclosure is measured to be 2.0 A at 0.3 V with a 133 µm×133 µm pad size, while the prior art ACA interconnects breakdown current is 0.3 A at 0.47 V with a 100 µm×100 µm pad size as shown in FIG. 3. The saturation current point of the ACA arrangement of the present disclosure, where the current value starts to deviate from a linear voltage-current curve due to the increasing resistance of the interconnects, was observed to be 1.3 A at 0.15 V. The power-handling capability increased by as much as 425% in the ACA arrangement of the present disclosure as compared to the prior art ACA interconnects. This significant improvement indicates that a few thick agglomerated columns by the self-assembly process are more useful than a large number of thin individual columns in a high-power handling test. This conclusion is based on the understanding that the resistance of individual columns is not identical and the breakdown of columns occurs in succession at a certain point. In addition, the position of the particles are ideally suited for radio frequency (RF) interconnects since the current is located at the edge of the interconnects due to the skin effect. Therefore, this experimental result indicates that the interconnects of the ACA arrangement of the present disclosure are capable of transferring a power of 100 W in a 50Ω system.

Figures 4, 5:
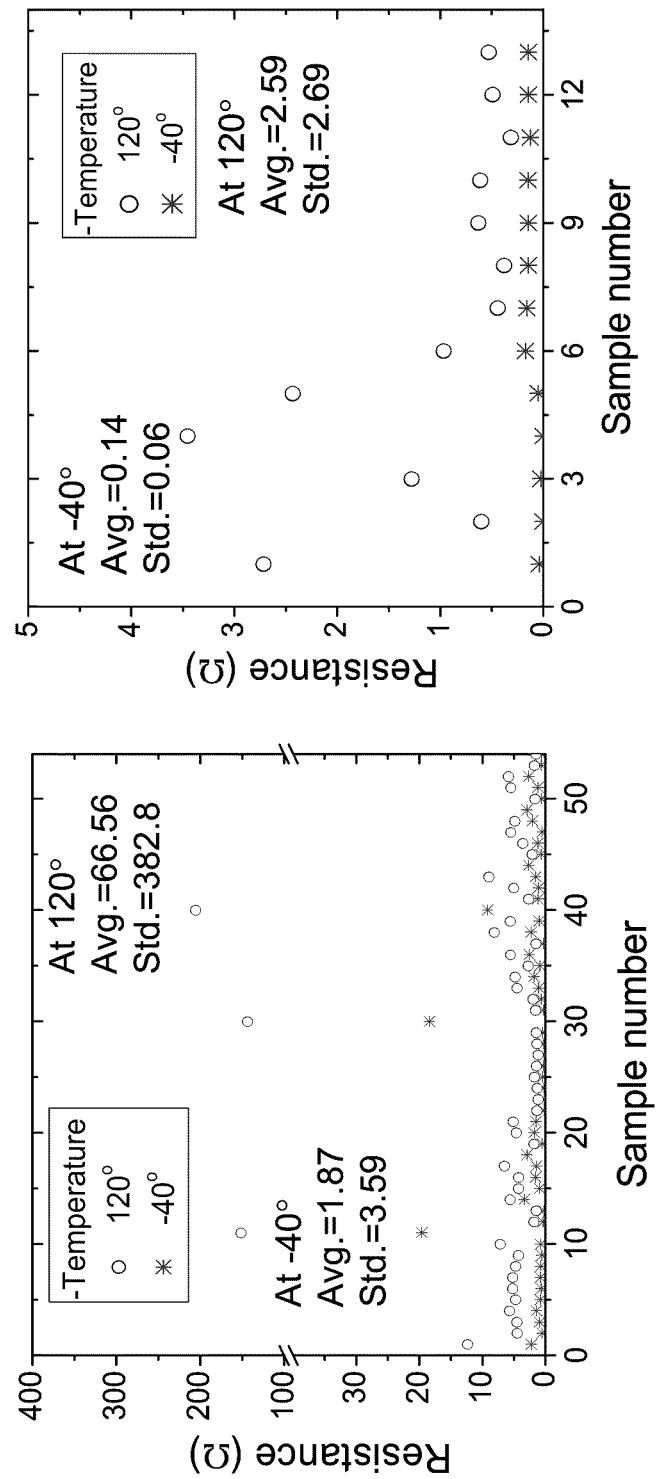
FIG. 4 is a graph of resistance vs. sample number results from a thermal cycling test for the ACA arrangement of the prior art.
FIG. 5 is a graph of resistance vs. sample number results from a thermal cycling test for the ACA arrangement of FIG. 1A.

Referring to FIGS. 4 and 5, results of thermal cycling tests are provided in the form of graphs of resistance (Ω) vs. sample number. Robust interconnects are important for practical implementation of a novel interconnect technology. A common failure mechanism in polymer-based packaging is mechanical cracking/delamination of the bonding layer due to expansion from moisture absorption and environmental temperature change. This effect leads to an increased resistance of the formed interconnects, or they could even become open circuits. In order to observe the degradation of ACA arrangement performance due to environmental effects (temperature change), a thermal-cycling test was performed for 150 cycles (900 hours). FIG. 4 depicts the graph of resistance vs. sample number of the prior art ACA interconnects. At −40° C., average resistance was found to be about 1.87Ω with a standard deviation of 3.59Ω. At 120° C., average resistance was found to be about 66.56Ω with a standard deviation of 382.8Ω. FIG. 5 depicts the graph of resistance vs. sample number of the ACA arrangement of the present disclosure. At −40° C., average resistance was found to be about 0.14Ω with a standard deviation of 0.06Ω. At 120° C., average resistance was found to be about 2.59Ω with a standard deviation of 2.69 Ω.

Figure 6A:
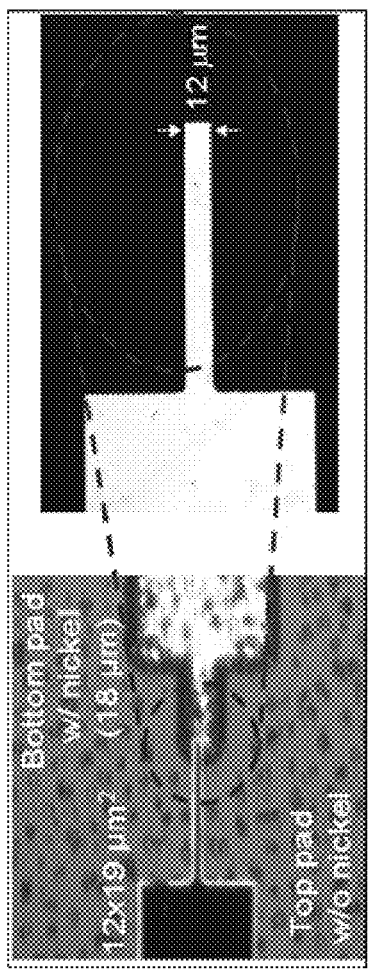
FIG. 6A is a top-view image of a glass sample with 12 μm×19.0 μm pad size after assembly according to the ACA arrangement of the present disclosure.
Figure 6B:
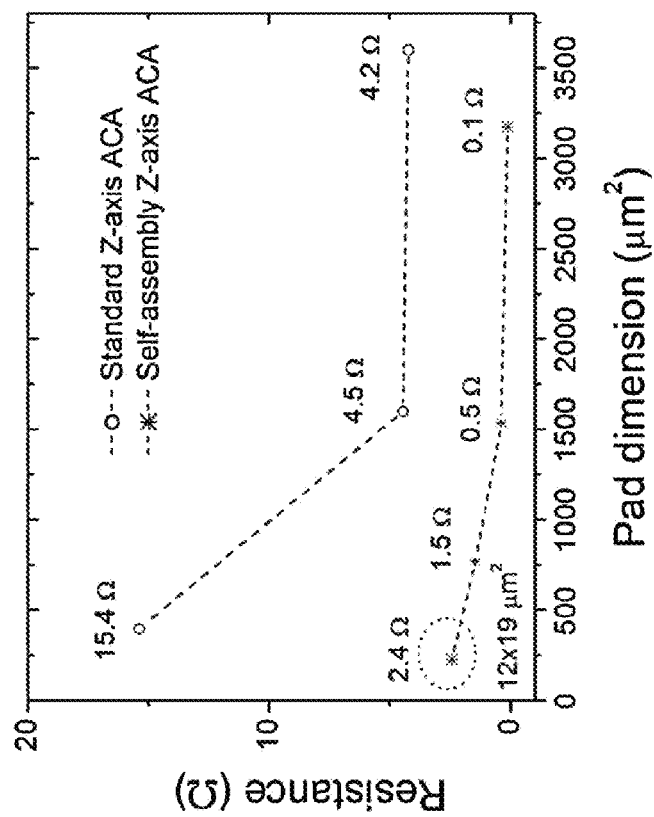
FIG. 6B is a graph of resistance vs. pad dimension ($\mu m^2$) for the ACA arrangement of the prior art and the ACA arrangement of FIG. 1A.

In order to investigate small-size pad capability of the ACA arrangement of the present disclosure, glass samples with less than 60 µm×60 µm pad area were fabricated. A layer of 18 µm thick nickel metal was deposited on a gold pattern of the glass samples by an electroplating process. The top-view image of a glass sample with 12 µm×19.0 µm pad size after assembly is shown in FIG. 6A. The average resistance was measured to range from 0.1Ω at 56 µm×56 µm to 2.4Ω at 12 µm×19.0 µm as shown in FIG. 6B. In comparison to the prior art ACA interconnects, the average resistance of the test samples of the ACA arrangement of the present disclosure is significantly reduced to 2.4Ω at 12 µm×19 µm pad size when compared to the 15.4Ω at 20 µm×20 µm pad size in the prior art ACA interconnects. Because of the spatial selectivity capability of the self-assembly Z-axis ACA process, the increase in performance seen over the standard Z axis ACA process is not limited to a decrease in resistance at small pad sizes. Since the columns are less concentrated at the pads for the prior art ACA interconnects, the probability of a column being formed on a very small size pad is low, making that process unusable for very small pads. Therefore, the ability to generate robust interconnects with small pad sizes is one of the major strengths of the ACA arrangement of the present disclosure.

Figure 7A:
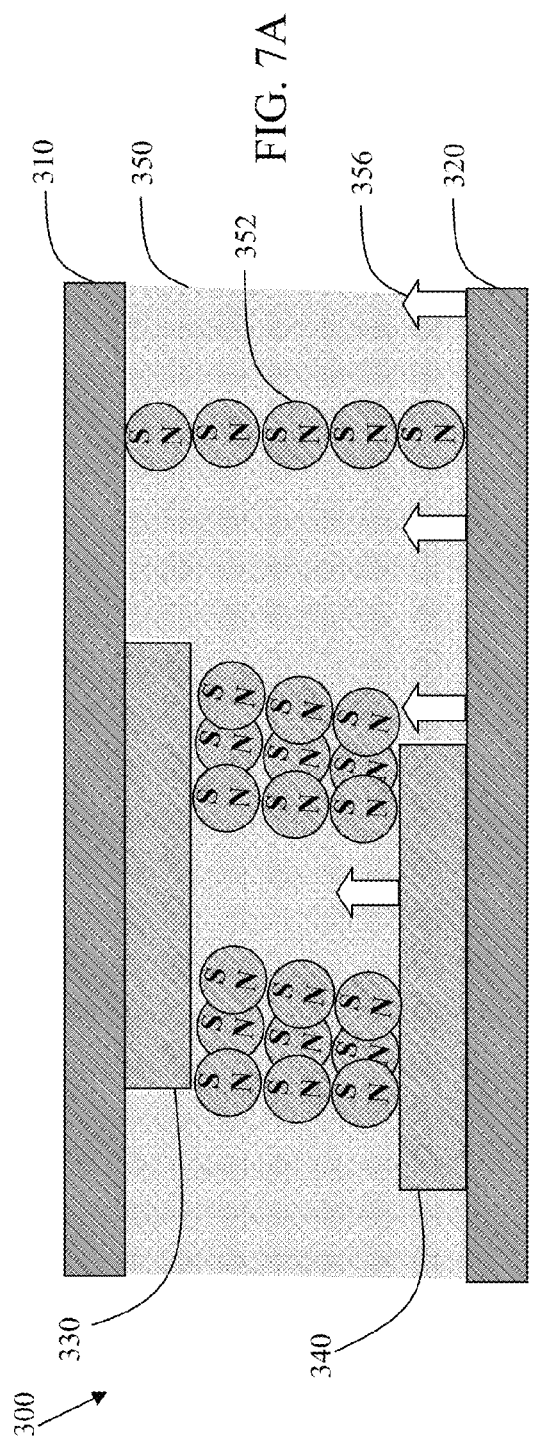
FIG. 7A is a schematic of an ACA arrangement according to one embodiment of the present disclosure including two misaligned pads each including a ferromagnetic material.

Referring to FIG. 7A, another major advantage of an ACA arrangement 300 according to another embodiment of the present disclosure is presented. Given the low density of particles between the pads in the prior art ACA interconnects (see FIG. 10), misalignment (i.e., non-symmetric alignment) between the pads can result in a significant performance degradation. In contrast, since the ferromagnetic particles in the ACA arrangement of the present disclosure are selectively brought together between the pads by the aid of the ferromagnetic pads, the interconnection between the pads can be formed at an angle resulting from a misalignment between the pads.

The ACA arrangement 300 includes a first substrate 310 and a second substrate 320. The ACA arrangement 300 also includes a first pad 330 and a second pad 340. The pads 330 and 340 include thick layers of ferromagnetic material (also referred to as ferromagnetic formations) formed by a deposition process, a growing process, or other processes known to a person of ordinary skill in the art.

Figure 7B:
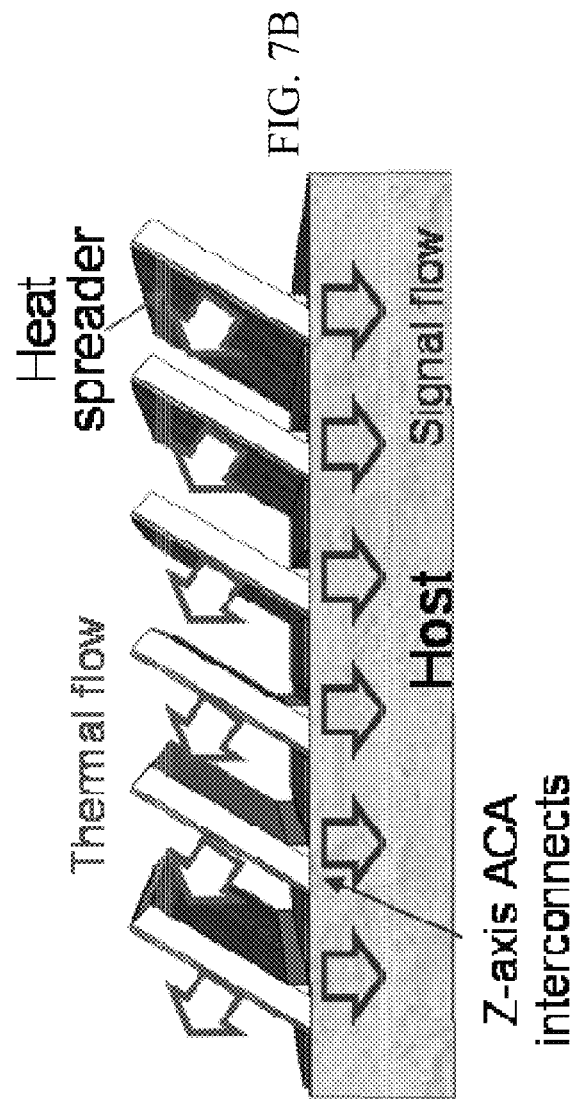
FIG. 7B is a schematic of an ACA arrangement according to one embodiment of the present disclosure including several misaligned pads each including a ferromagnetic material.

In addition, the ACA arrangement 300 includes a curable resin or a thermosetting resin 350 which contains ferromagnetic conductive particles 352. The ferromagnetic conductive particles 352 are initially uniformly dispersed in the curable resin 350. Once an external magnetic force is applied induced magnetic field 356 forms poles in the ferromagnetic conductive particles 352 causing these particles to be attracted to one another thereby forming columns between the pads 330 and 340. It should be noted that the first ferromagnetic formation 330 is offset from the second ferromagnetic formation 340. This misalignment can be the result of processing error when aligning the first substrate 310 above the second substrate 320 or intentionally produced to avoid an obstacle between the pads 330 and 340. The latter is particularly important when intentionally angling multiple substrates above a single host substrate for improved thermal flow as depicted in FIG. 7B.

Figure 8:
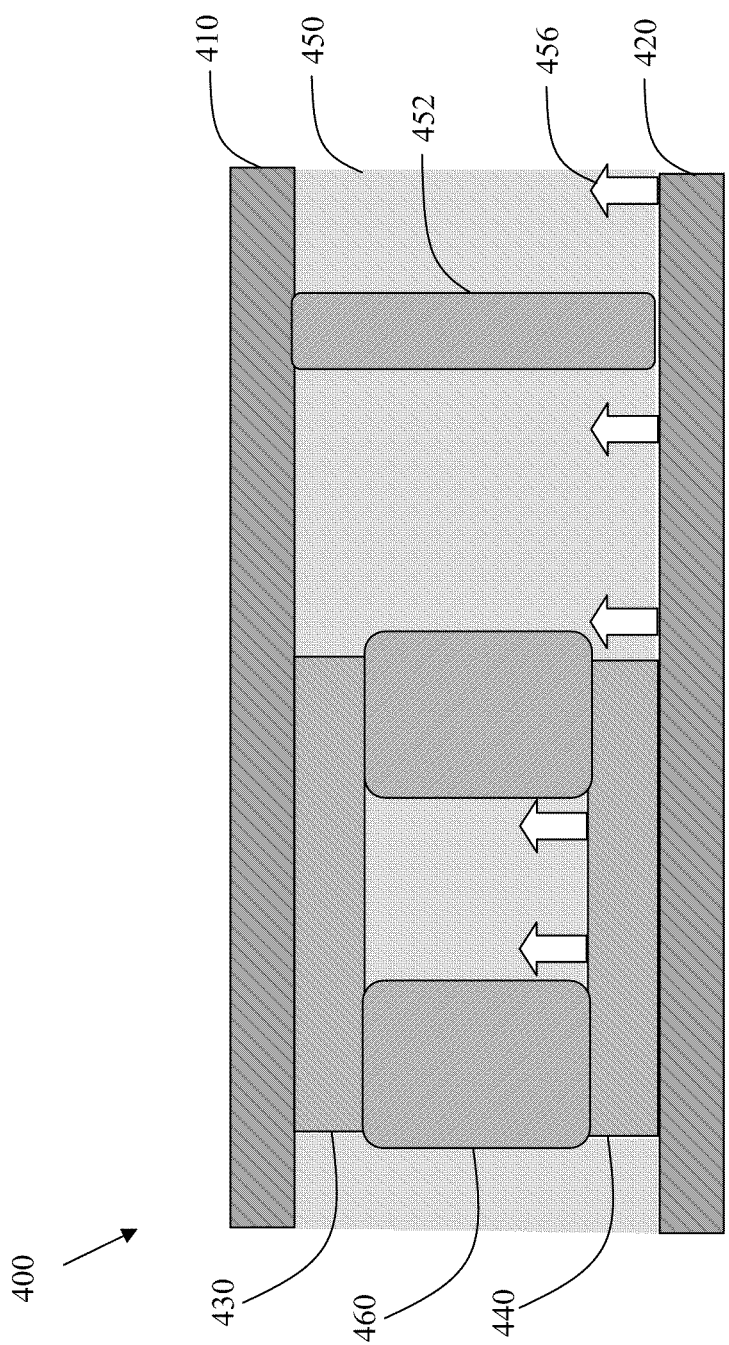
FIG. 8 is a schematic of an ACA arrangement according to one embodiment of the present disclosure including two aligned pads each including a ferromagnetic material wherein ferromagnetic conductive particles which have formed columns between the pads are fused to each other.

Referring to FIG. 8, an ACA arrangement 400 according to another embodiment of the present disclosure is presented. The ACA arrangement 400 includes a first substrate 410 and a second substrate 420. The ACA arrangement 400 also includes a first pad 430 and a second pad 440. The pads 430 and 440 include thick layers of ferromagnetic material (also referred to as ferromagnetic formations) formed by a deposition process, a growing process, or other processes known to a person of ordinary skill in the art.

In addition, the ACA arrangement 400 includes a curable resin or a thermosetting resin 450 which contains ferromagnetic conductive particles 452. The ferromagnetic conductive particles 452 are initially uniformly dispersed in the curable resin 450. Once an external magnetic force is applied induced magnetic field 456 forms poles in the ferromagnetic conductive particles 452 causing these particles to be attracted to one another thereby forming columns between the pads 430 and 440. After agglomeration of the randomly dispersed ferromagnetic conductive particles 452 at the edges of the I/O pads, heat is selectively induced to form ferromagnetic columns by an induction heating process. As a result, the agglomerated particles in the columns fuse together and the conductive-fused interconnects are formed (the fused state is shown in FIG. 8).

In another alternative embodiment, only one pad of the two pads 130 and 140 (see FIG. 1) is formed with a ferromagnetic formation. While not as dense of ferromagnetic particle columns may form as compared to the columns formed between two ferromagnetic pads, the formed columns are still more dense and predictable as compared to the prior art ACA interconnects.

Figure 9:
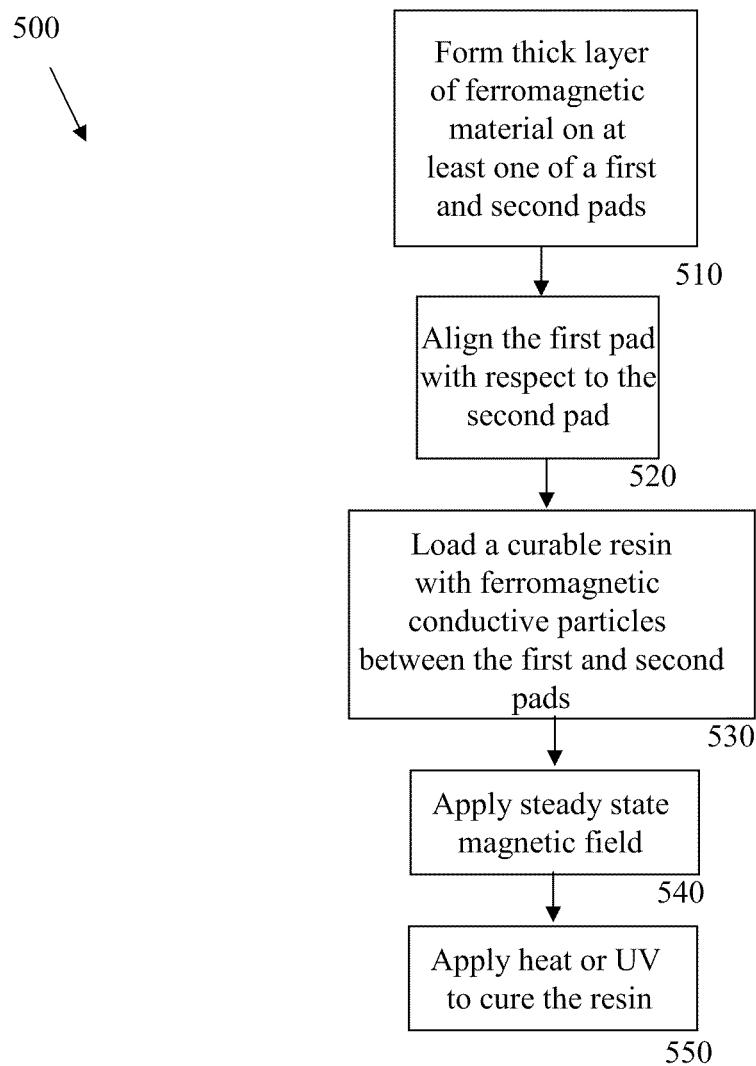
FIG. 9 is a flow chart for processing the ACA arrangement according to the present disclosure.

Referring to FIG. 9, a flow chart 500 for processing the ACA arrangement according to the present disclosure is depicted. As an initial step, a thick layer of ferromagnetic material is formed on at least one of a first and second pad (step 510). Next, the first and second pads are aligned (step 520). Next, a curable resin with ferromagnetic particles is loaded between the first and second pads (step 530). Next, a steady state magnetic field is applied across the first and second pads (step 540). Once the ferromagnetic conductive particles form in clusters of columns between the first and second pads, heat or ultraviolet light is applied to cure the curable resin (step 550).

An alternative process embodiment includes placing the first pad with respect to the second pad in an intentional misalignment for various reasons, such as improved heat flow. Another alternative process embodiment includes forming a thick layer of ferromagnetic material over both pads. Yet another alternative embodiment includes forming a layer of a material with high conductivity over the ferromagnetic material for improved conductivity to the substrate or other circuitry adjacent to the pads. Still another alternative embodiment includes fusing the ferromagnetic particles after these particles have formed columns between the pads.

In this disclosure a novel ACA arrangement and method of forming the same has been disclosed. According to this novel approach, high density columns of ferromagnetic particles are formed between ferromagnetic pads resulting in interpad and intrapad void regions. The separation width of the void regions in the test samples of the ACA arrangement according to the present disclosure was observed to be about 35 µm. The measured resistance values between the pads of the ACA arrangement of the present disclosure for 100 µm×100 µm pads was found to be reduced as compared to the resistance between the pads of the prior art ACA interconnect by approximately 74%. In addition, the breakdown current is significantly increased to 2.0 A at a 133 µm×133 µm pad size. In a thermal-cycling test, the average resistance of the ACA arrangement of the present disclosure is observed to be significantly reduced to 0.23Ω at the same pad size when compared to 4.36Ω of test samples in the prior art ACA interconnects. These experimental results validate that locally intensified column density due to a self-assembly process largely contributes to enhanced performance of formed interconnects at I/O pads. This significant improvement indicates that this material can be used as a replacement for conventional solder. Thus, this process is expected to be particularly useful in implementing packages of compact high power electronic circuits or accommodating multi-ICs on a single host.

While self assembly of ferromagnetic conductive particles for enhanced electrical connectivity has been discussed, it should be appreciated that the same structure and conceptual method of manufacturing can result in other useful structures. For example, the self assembly of the ferromagnetic conductive particles can be used to not only enhance electrical characteristics between two connectors, the same can also be used to enhance a thermal path between two connector. More particularly, different types of ferromagnetic particles can be used to 1) increase electrical conductivity between two connectors, 2) increase thermal conductivity between two connectors while minimizing electrical conductivity, and 3) increase both thermal and electrical conductivity between two connectors. For example, an electrically insulating material with high thermal conductivity can be used to coat the ferromagnetic particles. When the ferromagnetic particles are placed in an external magnetic field, the self assembly of these particles between two connectors can generate a high thermal conductive path between the two connectors while marinating an electrical isolation between the connectors. It is to be appreciated that these particles can be used to establish both electrical and thermal pathways between points of circuits that are to be connected. In a thermal conductivity application, the ferromagnetic formations provided on the connectors (see FIGS. 1 and 2), can be covered with a thermally conductive material that is electrically isolative. For example, layers equivalent to 234 and 244 (see FIG. 2) can be highly thermally conductive material that are also electrically isolative. In this situation the self assembled ferromagnetic particles can be configured to provide a high thermally conductive path while electrically isolating the connectors 230 and 240.

In addition, the ferromagnetic particles can be scaled to provide access to localized points in the electrical circuits. For example, thermally conductive/electrically isolative particles can be used that are sufficiently scaled down to form high density columns against the junction of a basic semiconductor element such as a transistor. In another example, electrically conductive particles can be used that are sufficiently scaled down to form high density columns against drain of a field effect transistor.

In another application of the self assembly of the ferromagnetic particles, devices with varying capacitances can be engineered. Since the ferromagnetic particles are in an electrically isolating resin, the particles can be manipulated to provide a varying capacitance.

While ferromagnetic formations disposed on connectors are discussed in the present disclosure, it should also be appreciated that self assembly of ferromagnetic particles can be engineered without presence of these ferromagnetic formations. Instead, using focused magnetic fields, using e.g., wave guides, can be utilized to cause the self assembly of the ferromagnetic particles. The main difference in the structure of this interconnect as compared to the prior art ACA interconnect is the contrast between the high density of these particles between the pads and away from the pads.

Those skilled in the art will recognize that numerous modifications can be made to the specific implementations described above. Therefore, the following claims are not to be limited to the specific embodiments illustrated and described above. The claims, as originally presented and as they may be amended, encompass variations, alternatives, modifications, improvements, equivalents, and substantial equivalents of the embodiments and teachings disclosed herein, including those that are presently unforeseen or unappreciated, and that, for example, may arise from applicants/patentees and others.

The invention claimed is:

1. An anisotropic conductive adhesive (ACA) arrangement, the ACA arrangement comprising:
 a thermosetting resin disposed between a connector of a first structure and a connector of a second structure;
 a plurality of ferromagnetic conductive particles dispersed through the thermosetting resin,
 wherein the plurality of ferromagnetic conductive particles are uniformly dispersed to form columns between the connector of the first structure and the connector of the second structure, and uniformly dispersed to form columns between the first structure and the second structure, and wherein a density of the ferromagnetic particles in the columns is substantially higher than a density of the plurality of ferromagnetic particles away from the columns;
 interpad void regions substantially void of ferromagnetic conductive particles between the columns that are formed between the connectors of the first and the second structures and the columns formed between a neighboring set of connectors; and
 interpad void regions substantially void of ferromagnetic conductive particles between the columns that are formed between the connectors of the first and the second structures.

2. The ACA arrangement of claim 1, wherein the thermosetting resin is in a cured state.

3. The ACA arrangement of claim 1, wherein the plurality of ferromagnetic conductive particles are composed of a material selected from the group consisting of nickel, gold-plated nickel, and silver-plated nickel.

4. The ACA arrangement of claim 1, wherein the connector of the first structure and the connector of the second structure are non-symmetrically opposed.

5. The ACA arrangement of claim 1, further comprising a first ferromagnetic formation disposed on the connector of the first structure.

6. The ACA arrangement of claim 5, further comprising:
 a second ferromagnetic formation disposed on the connector of the second structure.

7. The ACA arrangement of claim 6, wherein the first ferromagnetic formation and the second ferromagnetic formation include nickel.

8. The ACA arrangement of claim 6, wherein for connector size of about 133 μm×133 μm for the connectors of the first and second structures, break down current at about 0.3 V across the connectors of the first and second structures is about 2.0 A.

9. The ACA arrangement of claim 6, wherein average resistance between the connectors of the first and second structures range from about 0.1 Ω at connector size of about 56 μm×56 μm to about 2.4 Ω at connector size of about 12 μm×19.0 μm.

10. The ACA arrangement of claim 1, wherein the plurality of ferromagnetic conductive particles in the columns formed between the first ferromagnetic formation and the connector of the second structure are fused.

11. The ACA arrangement of claim 1, wherein the interpad void regions are about 38.6 μm wide and the interpad void regions are about 61.4 μm wide.

* * * * *